(12) United States Patent
Cao et al.

(10) Patent No.: US 9,190,429 B2
(45) Date of Patent: Nov. 17, 2015

(54) MANUFACTURING METHOD OF ARRAY SUBSTRATE

(75) Inventors: Zhanfeng Cao, Beijing (CN); Seongyeol Yoo, Beijing (CN); Qi Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 13/458,478

(22) Filed: Apr. 27, 2012

(65) Prior Publication Data

US 2012/0276697 A1 Nov. 1, 2012

(30) Foreign Application Priority Data

Apr. 29, 2011 (CN) .......................... 2011 1 0112057
Apr. 25, 2012 (CN) .......................... 2012 1 0124197

(51) Int. Cl.
*H01L 21/00* (2006.01)
*H01L 27/12* (2006.01)

(52) U.S. Cl.
CPC .................................. *H01L 27/1288* (2013.01)

(58) Field of Classification Search
CPC .. H01L 27/1288; H01L 27/124; H01L 27/127
USPC ................ 436/742; 216/23, 49; 438/742, 725
See application file for complete search history.

(56) References Cited

U.S. PATENT DOCUMENTS

| | | | |
|---|---|---|---|
| 6,291,360 B1 * | 9/2001 | Moon | 438/725 |
| 2001/0017683 A1 * | 8/2001 | Hiroki et al. | 349/138 |
| 2001/0021475 A1 * | 9/2001 | Czech et al. | 430/5 |
| 2002/0176032 A1 * | 11/2002 | Maeda et al. | 349/43 |
| 2004/0157166 A1 * | 8/2004 | Liu et al. | 430/316 |
| 2007/0034879 A1 * | 2/2007 | Park et al. | 257/72 |
| 2008/0057607 A1 * | 3/2008 | Oke et al. | 438/30 |
| 2009/0047758 A1 * | 2/2009 | Yamazaki et al. | 438/158 |
| 2013/0029441 A1 * | 1/2013 | Hsu et al. | 438/30 |

* cited by examiner

*Primary Examiner* — Caridad Everhart
(74) *Attorney, Agent, or Firm* — Ladas & Parry LLP

(57) ABSTRACT

A manufacturing method of an array substrate, comprising the following steps: S1 forming a gate signal line and a gate electrode on a base substrate, successively depositing a gate insulating layer, an active layer, and a metal layer, faulting a mask formed of photoresist on the metal layer, and removing the metal layer outside a region for forming a data line and source/drain electrodes through the mask; S2. simultaneously etching the active layer and ashing the photoresist so as to expose the metal layer within a channel region; S3. etching the active layer exposed by the photoresist after being ashed after the step S2; S4. removing the metal layer within the channel region.

14 Claims, 12 Drawing Sheets

MANUFACTURING METHOD OF ARRAY SUBSTRATE

BACKGROUND

Embodiments of the disclosed technology relate to a manufacturing method of an array substrate.

TFT-LCDs have many advantages, such as small volume, low power consumption and non-radiation, and have dominated the current flat panel display market. A TFT-LCD is formed by bonding an array substrate and a color filter substrate. As shown in FIG. 1, a typical TFT-LCD array substrate mainly comprises: a base substrate (for example, glass substrate) 1, a gate electrode 2, a gate insulating layer 3 ($SiN_x$) formed on the gate electrode 2, an active layer, a data line and source/drain (S/D) electrodes 6 on the active layer, a passivation layer ($SiN_x$) 9 covering thereon, and a transparent pixel electrode (for example, ITO electrode) 7. For example, the active layer can be composed by a stack of an amorphous silicon thin film 4 (for example, a-Si:H) and an ohmic contact layer 5 (for example, $n^+$ a-Si). A passivation layer via hole 8 is disposed in the passivation layer 9 above the drain electrode, and the ITO electrode 7 is connected with the drain electrode through the passivation layer via hole 8. In the prior art, a four-mask (4-mask) process is often used in the manufacturing the TFT-LCD array substrate. The specific steps of the method will be described hereinafter by referring to FIGS. 2(a) to 2(d).

(1) depositing a gate metal film on a glass substrate 1, and forming a gate signal line (not shown) and a gate electrode 2 by using a gate mask, as shown in FIG. 2(a);

(2) successively depositing a gate insulation layer 3, an amorphous silicon thin film 4, an ohmic contact layer 5 and a metal layer 6 on the glass substrate 1 after the step (1), and forming a photoresist pattern by an exposure through a grey tone mask and a development process, and removing the redundant parts of the active layer, the metal layer 6 and the photoresist through multiple etching processes so as to form a data line, source/drain electrodes 6, and a channel between the source and drain electrodes, as shown in FIG. 2(b);

(3) depositing a thin film for forming a passivation layer 9 on the substrate 1 after the step (2), and forming a passivation layer via hole 8 in a portion of the passivation layer which located above the drain electrode by performing a masking and etching process on the passivation layer 9, as shown in FIGS. 2(c); and (4) depositing an ITO electrode layer on the substrate after the step (3), and forming a pixel electrode 7 by using an ITO mask, and the pixel electrode 7 is connected with the drain electrode through the passivation layer via hole 8, as shown in FIG. 2(d).

FIGS. 3-1(a) to 3-6(b) are schematic diagrams showing an etching effect of the above step (2) in the procedure of manufacturing the TFT-LCD array substrate by using the conventional 4-mask process, wherein FIGS. 3-1(a), 3-2(a), 3-3(a), 3-4(a), 3-5(a), and 3-6(a) are cross sectional views of a part corresponding to a data line and taken along a line A-A in FIG. 1, and FIGS. 3-1(b), 3-2(b), 3-3(b), 3-4(b), 3-5(b), and 3-6(b) are cross sectional views of a part corresponding to a thin film transistor (TFT) and taken along a line B-B in FIG. 1. In these figures, a stacking sequence from the bottom to the top of an amorphous silicon thin film 4, an ohmic contact layer 5, a metal layer 6, and a photoresist layer 10 is provided on a glass substrate 1. For convenience of illustration, the gate insulating layer is omitted in these figures.

The multiple etching processes in the step (2) are as follows in detail: firstly, removing most of the metal layer outside the pixel region by a first wet etching, as shown in FIGS. 3-2(a) and FIGS. 3-2(b); subsequently, removing most of the active layer outside the pixel region by an active layer etch (an etch for forming the pattern of the active layer), as shown in FIGS. 3-3(a) and 3-3(b); then thinning the photoresist by an ashing process so as to expose the metal layer within the channel region, as shown in FIGS. 3-4(a) and FIGS. 3-4(b); then performing a second wet etching process so as to remove the metal layer within the channel region, as shown in FIGS. 3-5(a) and 3-5(b); finally, etching a part of the active layer within the channel region by a $N^+$ etching process. Thus, a data line, a channel and source/drain electrodes are formed, as shown in FIGS. 3-6(a) and 3-6(b). The multiple etching processes are also called as a SDT etching process.

The multiple etching processes are complex and needs a long period of time. Generally, a gas mixture of $SF_6$ and $O_2$, which has a relatively large etching rate on the photoresist but small etching rate on the active layer, is used to ash the photoresist. In addition, a gas mixture composed of $SF_6$ and $Cl_2$, which has a relatively large etching rate on the active layer but small etching rate on the photoresist, is used in etching the active layer. The gas mixture has a relatively higher etching rate on the gate insulation layer at the lower part, so that the gate insulation layer is etched so much and an uneven embossing mura is caused. This unevenness may have influence on the product quality after a module is formed. Furthermore, in the multiple etching process of the conventional 4-mask process, the active layer is etched for forming the active layer pattern before the photoresist is ashed for exposing the channel region, and thus a relatively large amount of active layer wing (also called active layer tail) is remained at the two sides of the data line and the two sides of the TFT region (including the source/drain regions and the channel region), as shown by "h1" in FIGS. 3-6(a) and 3-6(b). The active layer wing at the two sides of the data line and the two sides of the TFT region may exert influence on the design quality, thereby degrading the product quality.

SUMMARY

An embodiment of the disclosed technology provides a manufacturing method of an array substrate, comprising the following steps: S1. forming a gate signal line and a gate electrode on a base substrate, successively depositing a gate insulating layer, an active layer, and a metal layer, forming a photoresist pattern on the metal layer, and removing the metal layer outside a region for forming a data line, a channel and source/drain electrodes with the photoresist pattern as an etching mask; S2. simultaneously etching the active layer outside the region for forming the data line, the channel and the source/drain electrodes and ashing the photoresist so as to expose the metal layer within a channel region; S3. removing the metal layer within the channel region by performing a wet etch or a dry etch so as to form the source/drain electrodes; S4. removing a part of the active layer within the channel region so as to form the channel; and S5. depositing a passivation layer on the base substrate after the step S4, and forming a passivation layer via hole in the passivation layer above the drain electrode; depositing a transparent pixel electrode layer, and forming a pixel electrode which is connected with the drain electrode through the passivation layer via hole.

Further scope of applicability of the disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF DRAWINGS

The disclosed technology will become more fully understood from the detailed description given hereinafter and the accompanying drawings which are given by way of illustration only, and thus are not limitative of the disclosed technology and wherein:

FIGS. 4-1(a) to 4-6(b) are schematic diagrams showing etching effect of a SDT etching during manufacturing TFT-LCD array substrate according to a first embodiment of the disclosed technology;

FIGS. 5-1(a) to 5-5(b) are schematic diagrams showing etching effect of a SDT etching during manufacturing TFT-LCD array substrate according to a second embodiment of the disclosed technology; and FIGS. 6-1(a) to 6-5(b) are schematic diagrams showing etching effect of a SDT etching during manufacturing TFT-LCD array substrate according to a third embodiment of the disclosed technology.

DETAILED DESCRIPTION

Embodiments of the disclosed technology now will be described more clearly and fully hereinafter with reference to the accompanying drawings, in which the embodiments of the disclosed technology are shown. Apparently, only some embodiments of the disclosed technology, but not all of embodiments, are set forth here, and the disclosed technology may be embodied in other forms. All of other embodiments made by those skilled in the art based on embodiments disclosed herein without mental work fall within the scope of the disclosed technology.

The manufacturing method of a thin film transistor liquid crystal display (TFT-LCD) array substrate according to the disclosed technology is described in detail as follows by taking in conjunction with the accompany figures and embodiments.

Figure 1:
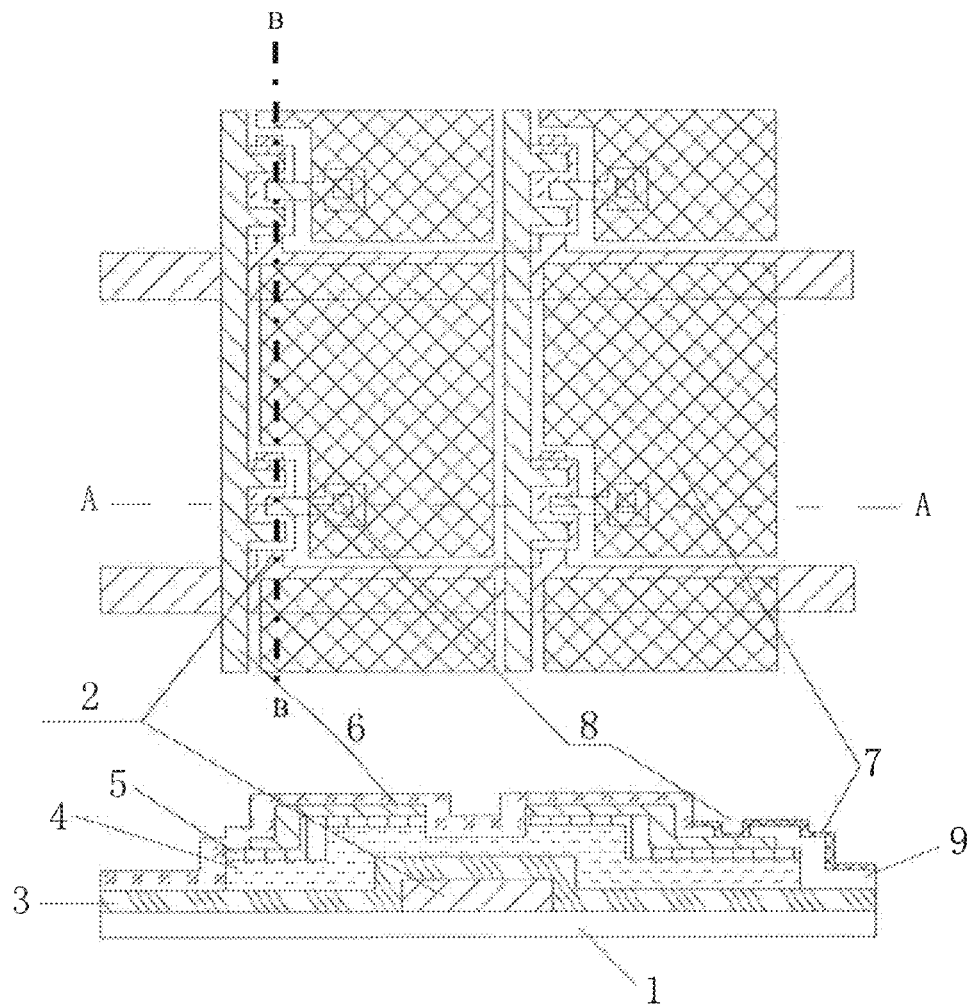
FIG. 1 is a top view and a cross sectional view taken along a line A-A of a thin film transistor liquid crystal display (TFT-LCD) array substrate.

In addition, the array substrate manufacturing by the method according to the embodiments of the disclosed technology has a similar configuration as shown in FIG. 1 except smaller active layer wing at the two sides of the data line and the TFT region, therefore, the configuration will not be repeated here.

First Embodiment

FIGS. 4-1(a) to 4-6(b) are schematic diagrams showing the etching effect of a SDT etching during manufacturing a TFT-LCD array substrate by the method according to the first embodiment of the disclosed technology, wherein FIGS. 4-1(a), 4-2(a), 4-3(a), 4-4(a), 4-5(a), and 4-6(a) are cross sectional views of a part corresponding to a data line, i.e., cross sectional views corresponding to a location as indicated by A-A in FIG. 1, and FIGS. 4-1(b), 4-2(b), 4-3(b), 4-4(b), 4-5(b), and 4-6(b) are cross sectional views of a part corresponding to a thin film transistor, i.e., cross sectional views corresponding to a location as indicated by B-B in FIG. 1. For convenience of illustration, the gate insulating layer is omitted in these figures. The method according to first embodiment of the disclosed technology comprises the following steps.

Figure 2A:
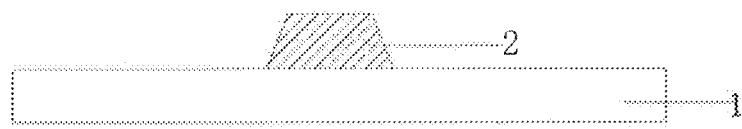
FIGS. 2(a) to 2(d) are schematic diagrams showing the conventional 4-mask process.
Figure 2B:
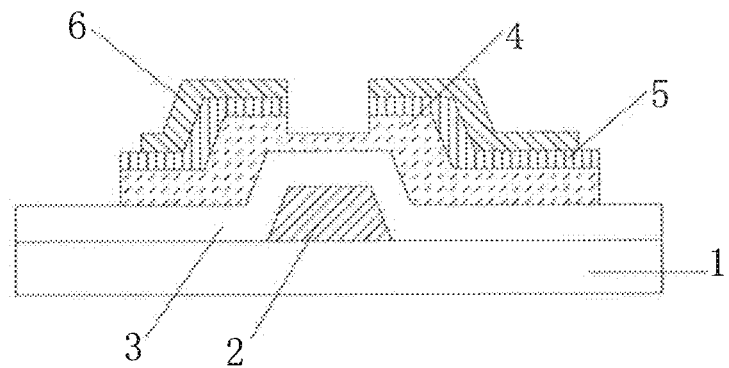
Figure 2C:
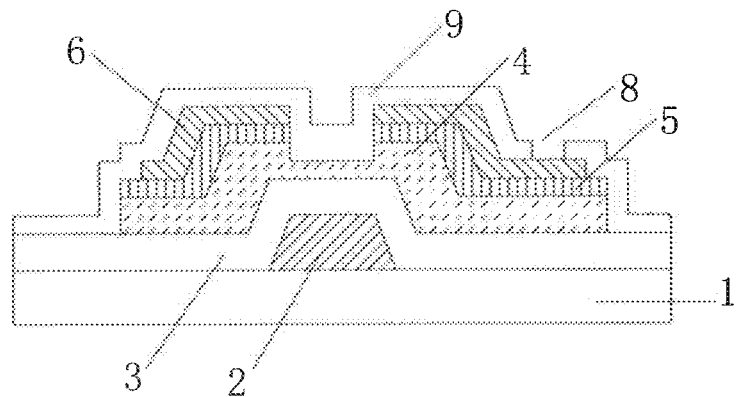
Figure 2D:
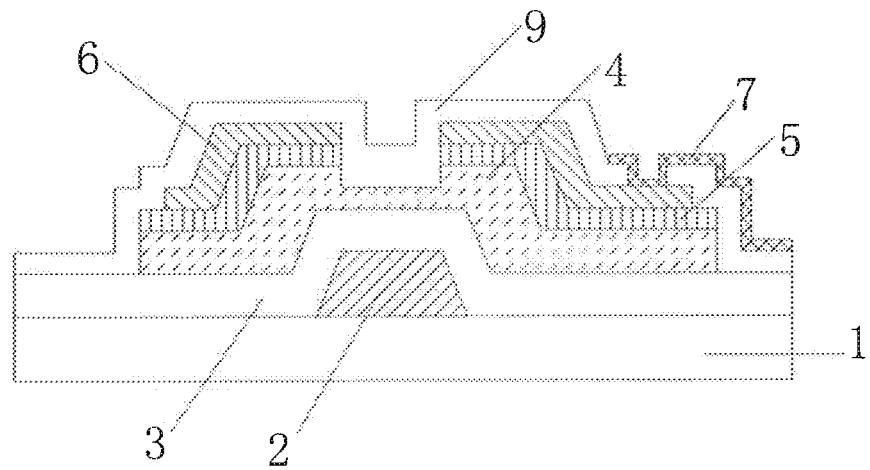
Figures 1A, 3:
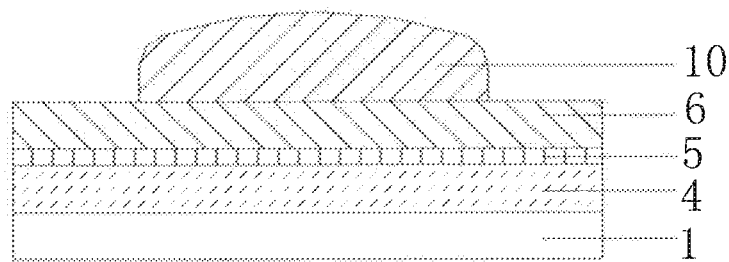
FIGS. 3-1(a) to 3-6(b) are schematic diagrams showing etching effect of a SDT etching during manufacturing a TFT-LCD array substrate by using the conventional 4-mask process.
Figures 1B, 3:
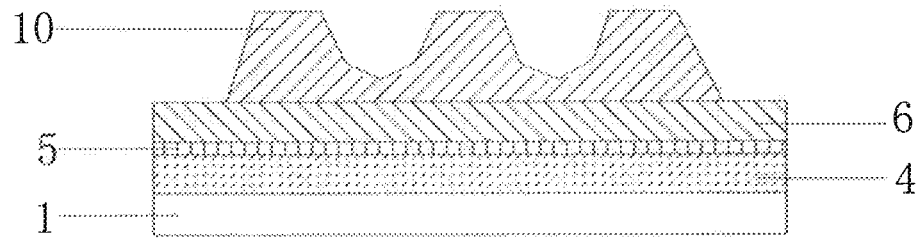
Figures 2A, 3:
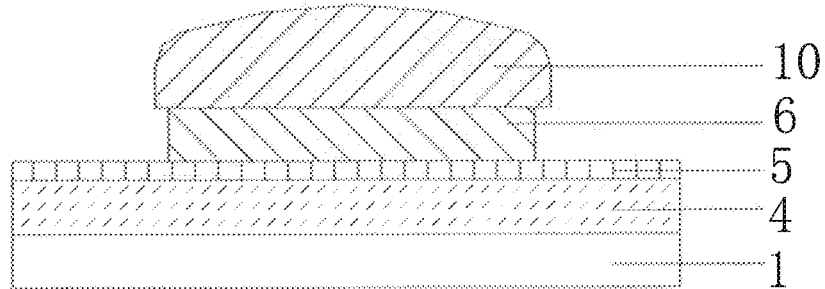
Figures 2B, 3:
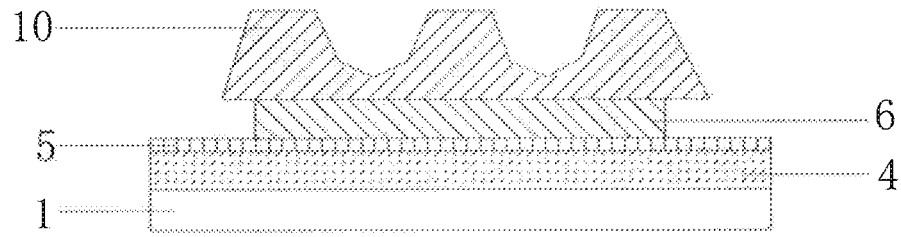
Figures 3, 3A:
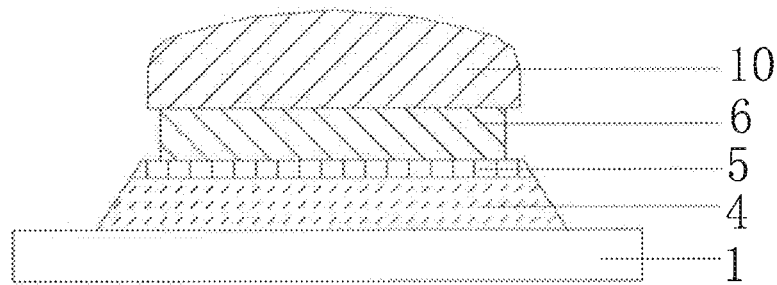
Figures 3, 3B:
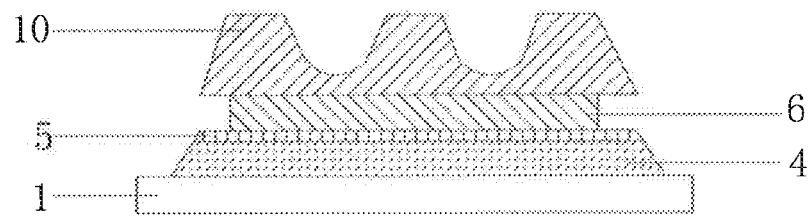
Figures 3, 4, 4A:
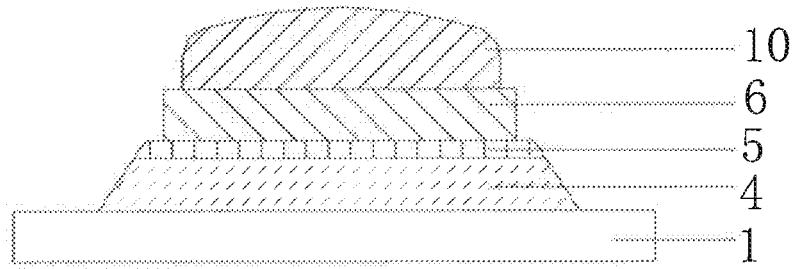

S1, forming a gate electrode signal line and a gate electrode on a base substrate (for example, a glass substrate) 1, successively depositing a gate insulating layer (not shown), an active layer (for example, including an amorphous silicon layer 4 and an ohmic contact layer 5), and a metal layer 6; forming a photoresist pattern by performing a exposure and development process through a gray tone mask or a half tone mask (the structure after the development process is shown in FIGS. 4-1(a) and 4-1(b)); and then performing a first wet etching so as to remove the metal layer 6 outside a region for forming a data line, a channel and source/drain electrodes, and the structure obtained after the first wet etching is shown in FIGS. 4-2(a) and 4-2(b).

S2, simultaneously etching the active layer outside the region for forming the data line, the channel and the source/drain electrodes and ashing the photoresist so as to expose the metal layer 6 within the channel region. As shown in FIGS. 4-3(a) and 4-3(b), after this step, the width of the top portion of the active layer is identical to the width of the photoresist 10 after being ashed. In this step, the active layer outside the region for forming the data line, the channel and the source/drain electrodes is only partially etched in the thickness direction (for example, the thickness is reduced), but not etched completely, as shown in FIG. 4-3(a).

In the step of S2, a gas mixture of $SF_6$, $O_2$ and $Cl_2$ is used. As for this gas mixture, it can have a relatively large etching rate on both the photoresist and the active layer by adjusting the content of each gas therein. Alternatively, the $SF_6$ in the above gas mixture can be replaced by other gas containing fluorine such as $CF_4$; and the $Cl_2$ can be replaced by other gas containing chlorine such as $CH_3Cl$. In addition, after the step S2, a certain thickness of active layer outside the region for forming the data line, the channel and the source/drain electrodes is remained, and this layer of the residual active layer can protect the underlying gate insulating layer from being etched by the above gas mixture.

Figures 3, 4, 4B:
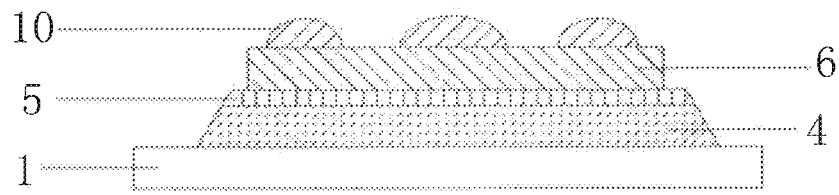

S2-1, performing an etching with a large etching rate on the residual active layer outside the region for forming the data line, the channel and the source/drain electrodes and a part of photoresist on the substrate after the step S2, so as to remove the entire of the residual active layer outside the region for forming the data line, the channel and the source/drain electrodes and a part of the photoresist 10. In this step, the etching rate on the active layer is relatively larger comparing with that in the step 2. Moreover, as shown in FIGS. 4-4(a) and 4-4(b), on the substrate 1 after the step S2-1, the width of the active layer at both sides of the data line is reduced, and is smaller than that after the step S2.

S3, performing a second wet etch or a dry etch on the substrate 1 after the step S2-1 so as to remove the metal layer 6 within the channel region and form the source/drain electrodes, as shown in FIGS. 4-5(a) and 4-5(b).

S4, removing a part of the active layer within the channel region by a $N^+$ etching so as to form a channel, as shown in FIGS. 4-6(a) and 4-6(b). The width of the active layer wing is indicated as "h2" in FIGS. 4-6(a) and 4-6(b). In this etching step, it should be ensured that at least the entire of the ohmic layer in the channel region is removed, as shown in FIG. 4-6(b).

S5, depositing a passivation layer on the substrate 1 after the step S5 and forming a passivation layer via hole in the portion corresponding to the drain electrode; depositing a ITO electrode layer, and forming a ITO electrode (pixel electrode) which is connected with the drain electrode through the passivation layer via hole.

The above mentioned step S1 may comprise the following steps:

S1.1, depositing a gate metal thin film on the base substrate 1, and forming the gate signal line and the gate electrode by a patterning process; the patterning process may comprises the steps such as photoresist applying, exposure, development, and etching;

S1.2, successively depositing the gate insulating layer, the active layer composed of the amorphous silicon layer 4 and the ohmic contact layer 5, and the metal layer 6, and forming the photoresist pattern by performing the exposure and development process by using a gray tone mask or a half tone mask, as shown in FIGS. 4-1(*a*) and 4-1(*b*); and S1.3, removing the part of the metal layer 6 outside the region for forming the data line, the channel and the source/drain electrodes by using a wet etching, as shown in FIGS. 4-2(*a*) and 4-2(*b*).

In the above mentioned step S5, forming the pixel electrode may comprise depositing an ITO electrode layer after forming the passivation layer and the via hole therein, forming the ITO electrode by using an ITO mask, and the ITO electrode and the drain electrode being connected through the passivation layer via hole.

The SDT etching is performed by two steps of dry etch in the steps S2 and S2.1, and its total time is shorter than that in the 4-mask process of the prior art. For example, the processing time for these steps is reduced by 40-70 seconds, which improves the yield. On the substrate after the step S2.1, the width "h2" of the active layer wing at both sides of the data line is reduced comparing with the width "h1" in the prior art, thus the boundary of the ITO pattern (i.e., the ITO electrode) can be shifted in a direction towards the data line; thus, the space between the adjacent ITO patterns is reduced and the aperture ratio is enhanced. In addition, the amount of the active layer wing (the part extends beyond the data line) is reduced, i.e., the width of the active layer under the data line is reduced, for example, by about 0.5-1.0 μm for each side, which can improves the design quality and the product quality. In addition, no defectiveness will occur in the two dry etch processes of the steps S2 and S2.1, which avoids the occurrence of unevenness of embossing mura. In addition, the width "h2" of the active layer wing at the two sides of the TFT region is shorter than the "h1" (as shown in FIG. 3-6(*b*)) in the prior art, so that the boundary of the ITO pattern can be shifted in a direction towards the TFT region, which can enhance the design quality and the product quality. In addition, it should be known that the pixel electrode is described as an ITO electrode in this embodiment. However, the disclosed technology does not limited thereto and the pixel electrode can be made of other conductive transparent materials such as indium zinc oxide (IZO).

Second Embodiment

Figures 3, 4, 5, 5A:
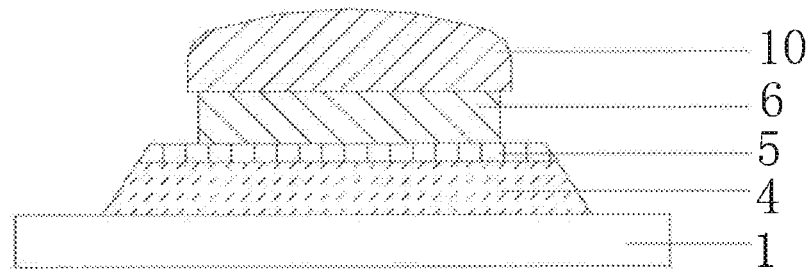

FIGS. 5-1(*a*) to 5-5(*b*) are schematic diagrams showing the etching effect of a SDT etching during manufacturing a TFT-LCD array substrate by the method according to the embodiment of the disclosed technology, wherein FIGS. 5-1(*a*), 5-2(*a*), 5-3(*a*), 5-4(*a*), and 5-5(*a*) are cross sectional views of a part corresponding to a data line, i.e., cross sectional views corresponding to a location as indicated by A-A in FIG. 1, and FIGS. 5-1(*b*), 5-2(*b*), 5-3(*b*), 5-4(*b*), and 5-5(*b*) are cross sectional views of a part corresponding to a thin film transistor, i.e., cross sectional views corresponding to a location as indicated by B-B in FIG. 1. For convenience of illustration, the gate insulating layer is omitted in these figures. The method according to an embodiment of the disclosed technology comprises the following steps.

A1, forming a gate electrode signal line and a gate electrode on a base substrate (for example, a glass substrate) 1, successively depositing a gate insulating layer (not shown), an active layer (for example, including an amorphous silicon layer 4 and an ohmic contact layer 5), and a metal layer 6; forming a photoresist pattern by performing a exposure and development process through a gray tone mask or a half tone mask (the structure after the development process is shown in FIGS. 5-1(*a*) and 5-1(*b*)); and then performing a first wet etching so as to remove the metal layer 6 outside a region for forming a data line, a channel and source/drain electrodes, and the structure obtained after the first wet etching is shown in FIGS. 5-2(*a*) and 5-2(*b*).

A2, simultaneously etching the active layer outside the region for forming the data line, the channel and the source/drain electrodes and ashing the photoresist so as to expose the metal layer 6 within the channel region. As shown in FIGS. 5-3(*a*) and 5-3(*b*), after this step, the width of the top portion of the active layer is identical to the width of the photoresist 10 after being ashed. In this step, the active layer outside the region for forming the data line, the channel and the source/drain electrodes is only partially etched (for example, the thickness is reduced), but not etched completely, as shown in FIG. 5-3(*a*).

In the step of A2, a gas mixture of $SF_6$, $O_2$ and $Cl_2$ is used. As for this gas mixture, it can have a relatively large etching rate on both the photoresist and the active layer by adjusting the content of each gas therein. Alternatively, the $SF_6$ in the above gas mixture can be replaced by other gas containing fluorine such as $CF_4$; and the $Cl_2$ can be replaced by other gas containing chlorine such as $CH_3Cl$. In addition, after the step A2, a certain thickness of active layer outside the region for forming the data line, the channel and the source/drain electrodes is remained, and this layer of the residual active layer can protect the underlying gate insulating layer from being etched by the above gas mixture.

A3, performing a second wet etch or a dry etch on the substrate 1 after the step A2 so as to remove the metal layer 6 within the channel region and form the source/drain electrodes, as shown in FIGS. 5-4(*a*) and 5-4(*b*).

A4, removing a part of the active layer within the channel through a N+ etch to form the channel, and simultaneously removing the residual active layer outside the region for forming the data line, the channel and the source/drain electrodes (a second active layer etching), as shown in FIGS. 5-5(*a*) and 5-5(*b*). In this etching step, it should be ensured that at least the entire of the ohmic layer in the channel region is removed, as shown in FIG. 5-5(*b*).

A5, depositing a passivation layer on the substrate 1 after the step S5 and forming a passivation layer via hole in the portion corresponding to the drain electrode; depositing a ITO electrode layer, forming a ITO electrode (pixel electrode) which is connected with the drain electrode through the passivation layer via hole.

The thickness of the residual active layer after the step A2 is about 300-800 Å, and the residual active layer will be etched when performing the step A4. Generally, during the N+ etch in the step A4, the active layer within the channel will be etched by about 1000-1300 Å in thickness, so as to guarantee the residual active layer of 300-800 Å to be etched in the step A4 and an over-etch for ensuring the uniformity of the large substrate.

Compared with the method of the first embodiment, the method of the present embodiment is further simplified, saves the time for etching the residual active layer. Meanwhile, the switching time from the step S2 to the step S2-1 in the method of the first embodiment is omitted, and the yield can be enhanced. In addition, the width "h3" (as shown in FIGS. 5-5(a) and 5-5(b)) of the active layer wing at the two sides of the data lines and at the two sides of the TFT region is also satisfying.

Third Embodiment

Figures 3, 4, 5, 5B:
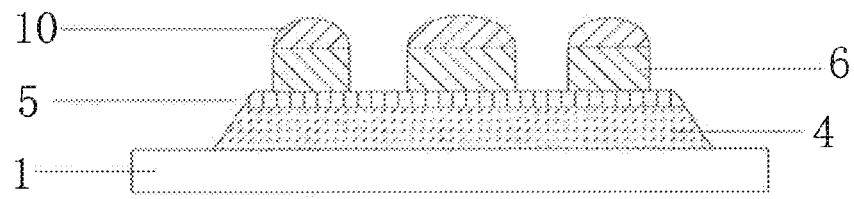
Figures 3, 4, 5, 6, 6A:
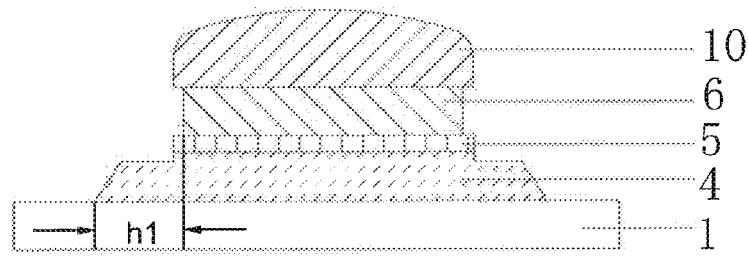
Figures 3, 4, 5, 6, 6B:
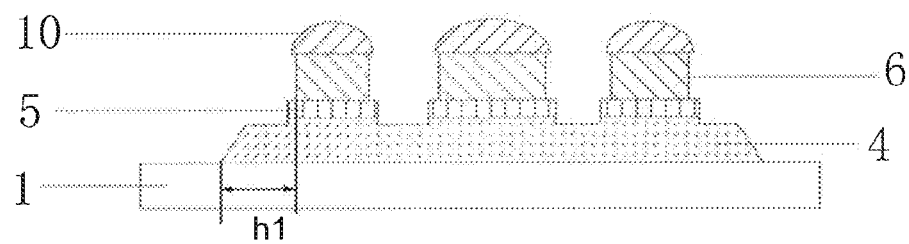
Figures 1A, 4:
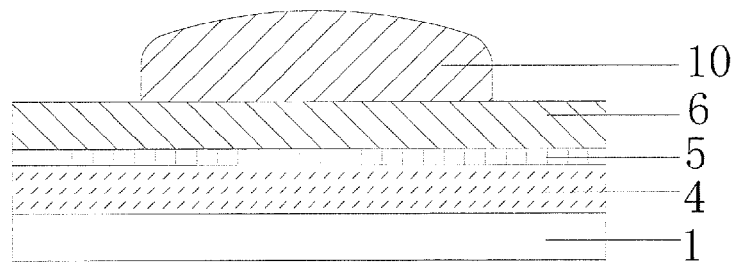
Figures 1B, 4:
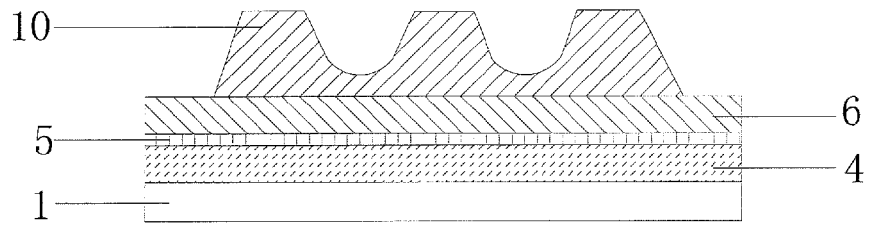
Figures 2A, 4:
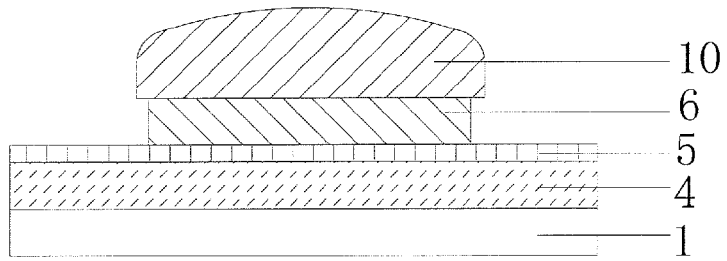
Figures 2B, 4:
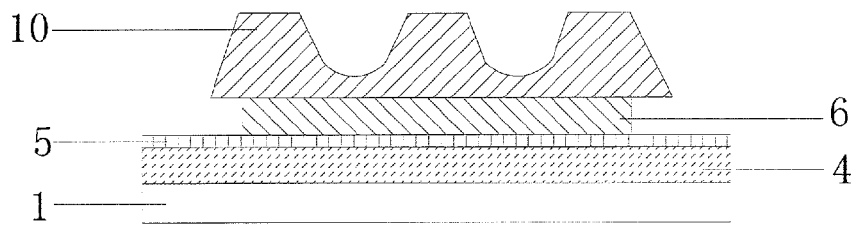
Figures 3A, 4:
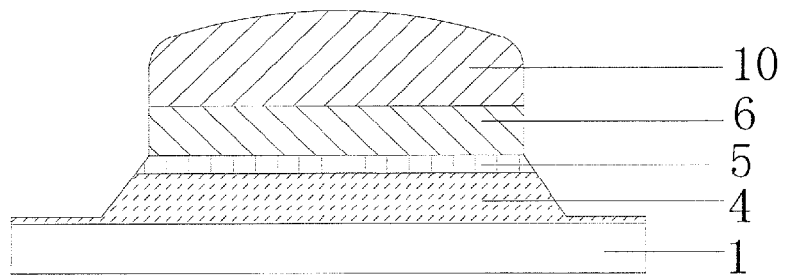
Figures 3B, 4:
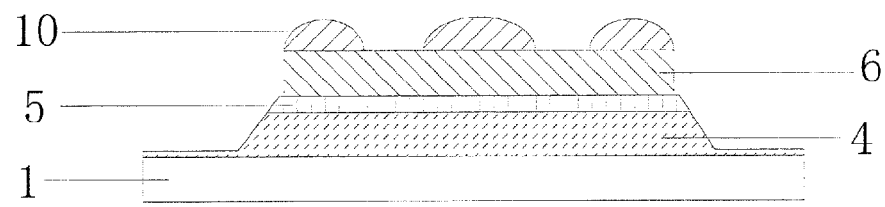
Figures 4, 4A:
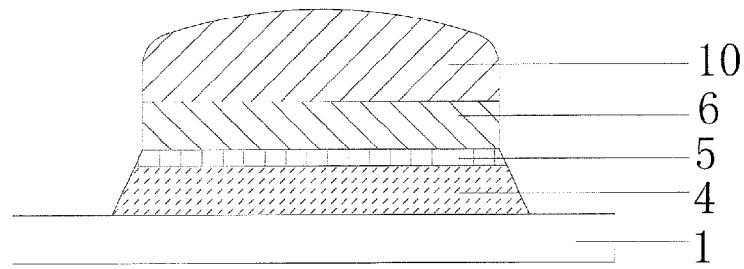
Figures 4, 4B:
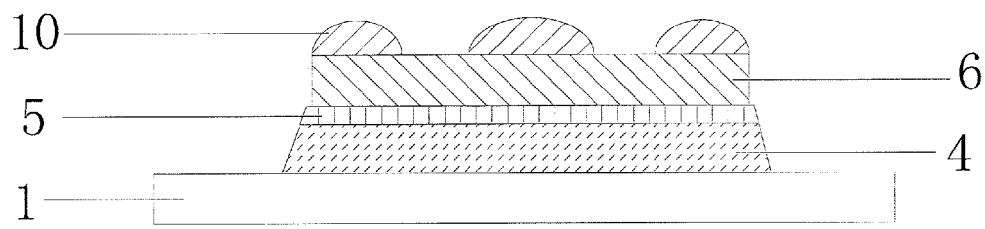
Figures 4, 5, 5A:
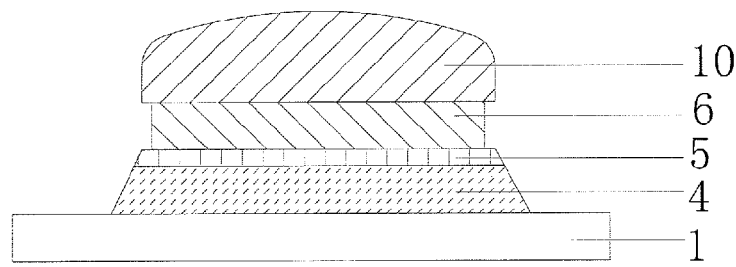
Figures 4, 5, 5B:
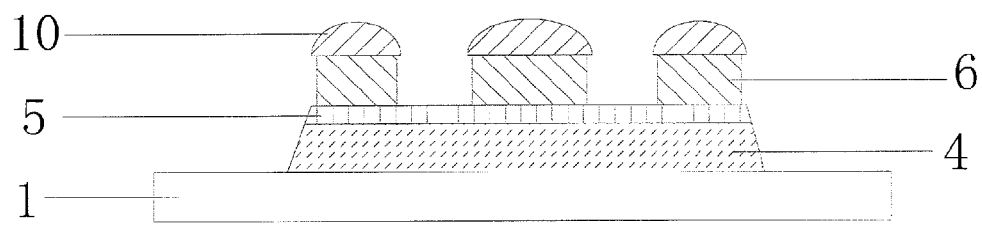
Figures 4, 5, 6, 6A:
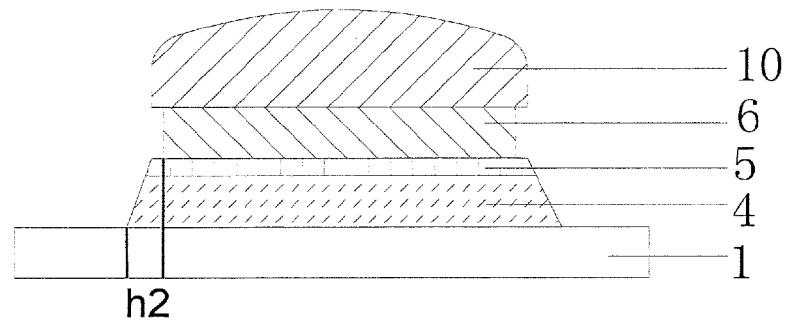
Figures 4, 5, 6, 6B:
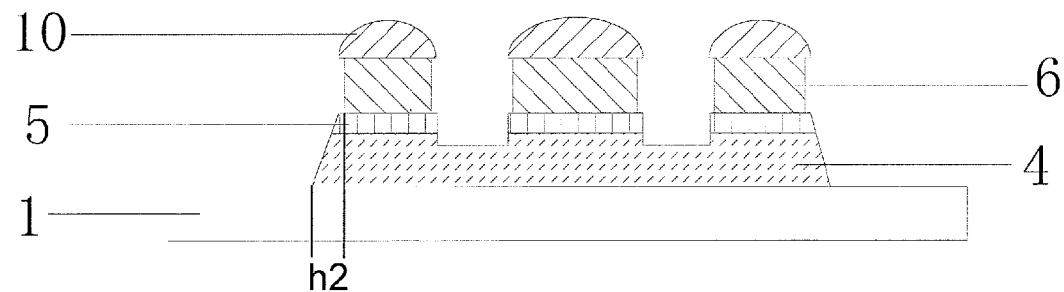
Figures 1A, 5:
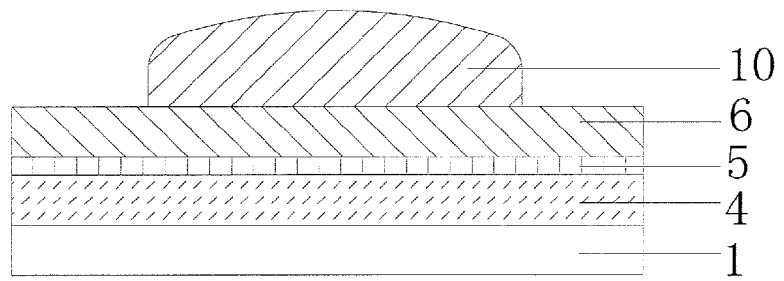
Figures 1B, 5:
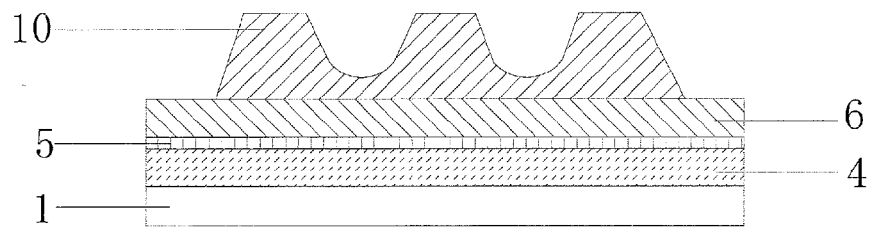
Figures 2A, 5:
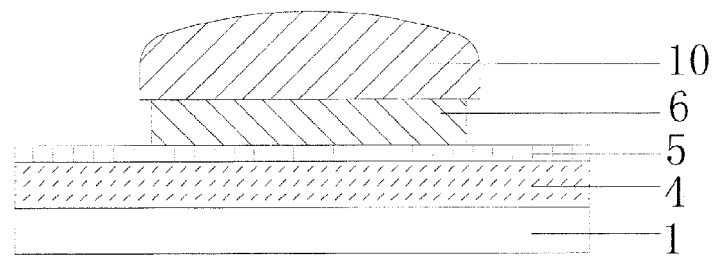
Figures 2B, 5:
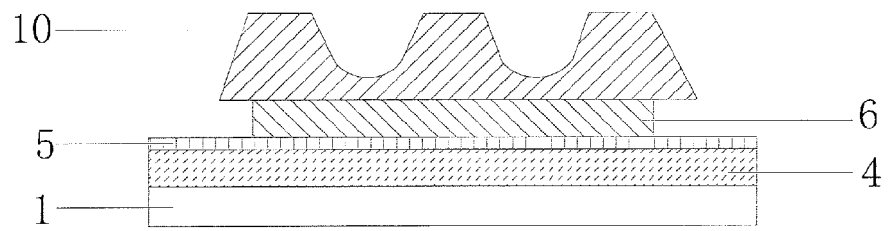
Figures 3A, 5:
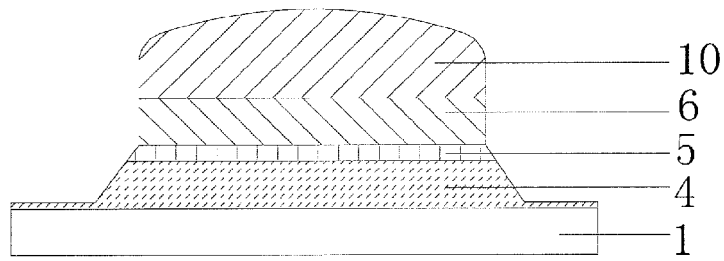
Figures 3B, 5:
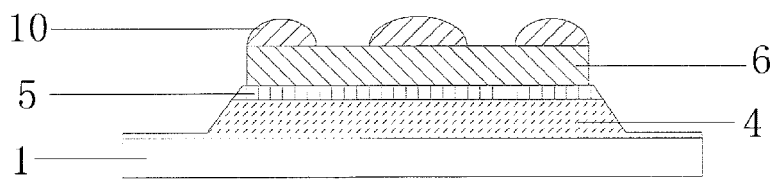
Figures 4A, 5:
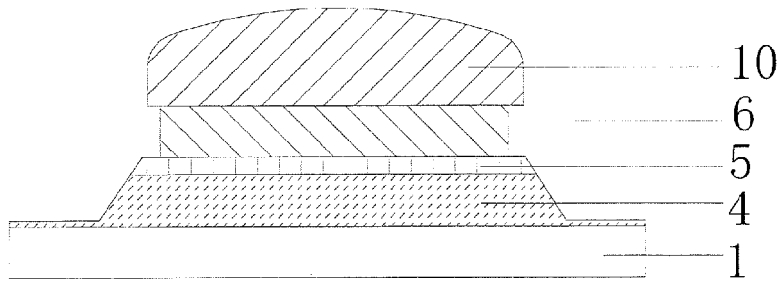
Figures 4B, 5:
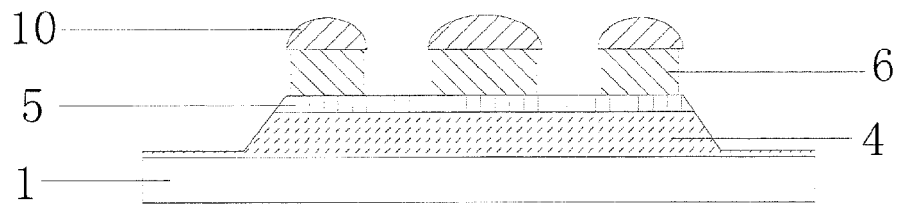
Figures 5, 5A:
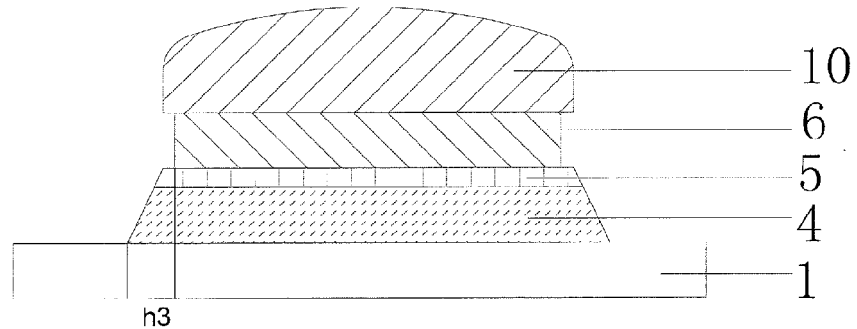
Figures 5, 5B:
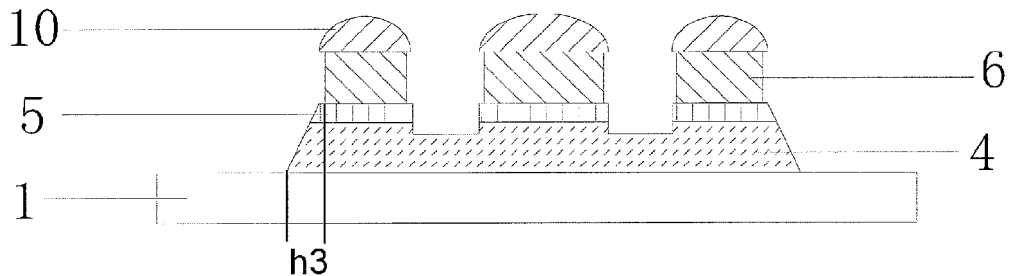
Figures 1A, 6:
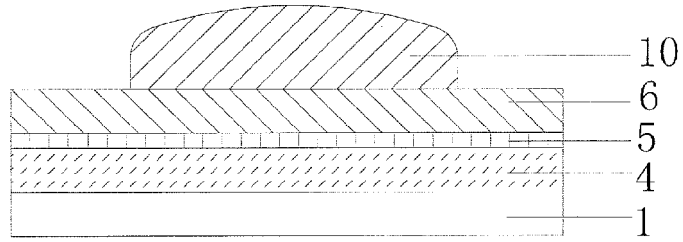
Figures 1B, 6:
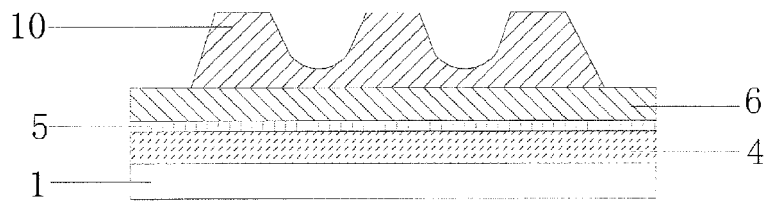
Figures 2A, 6:
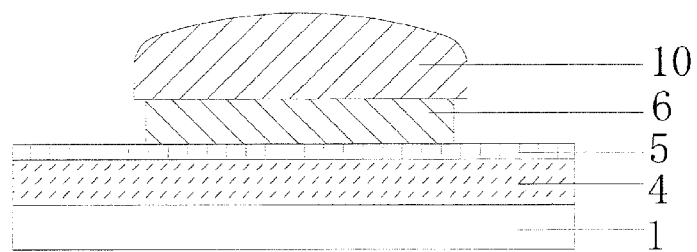
Figures 2B, 6:
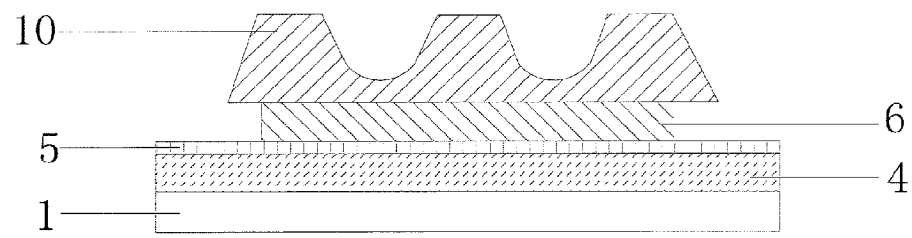
Figures 3A, 6:
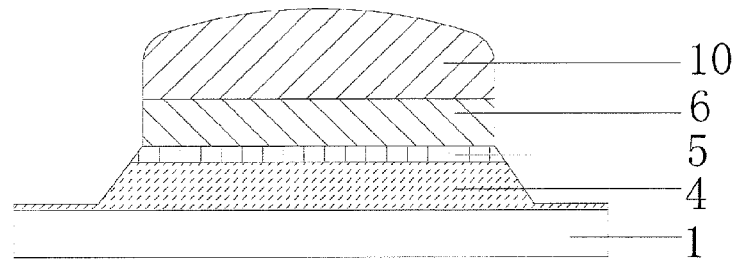
Figures 3B, 6:
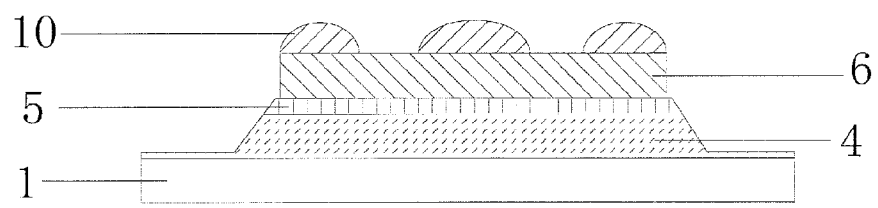
Figures 4A, 6:
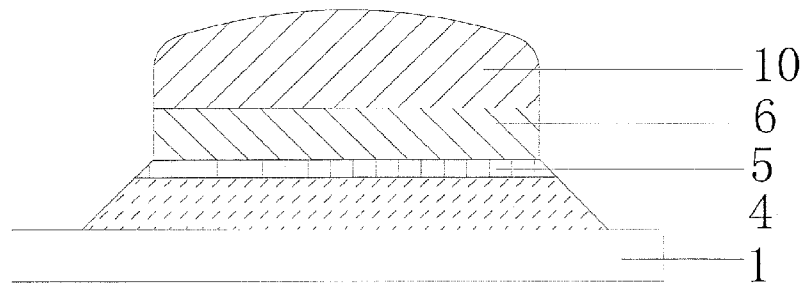
Figures 4B, 6:
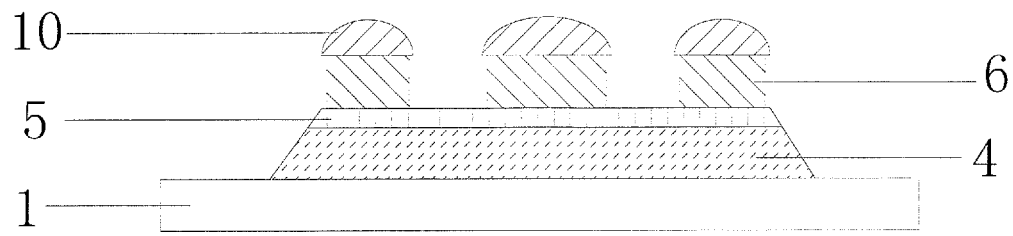
Figures 5A, 6:
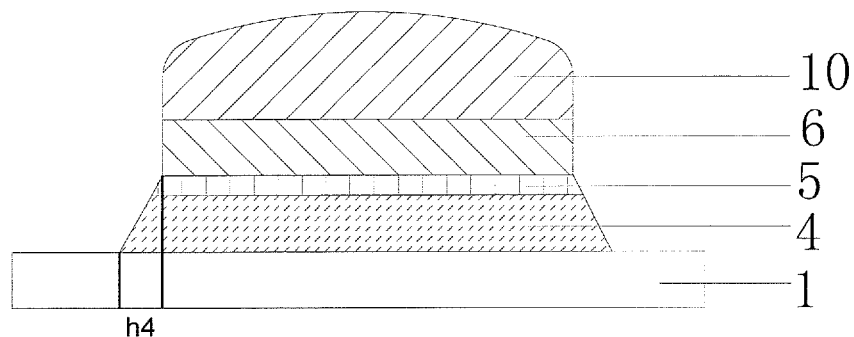
Figures 5B, 6:
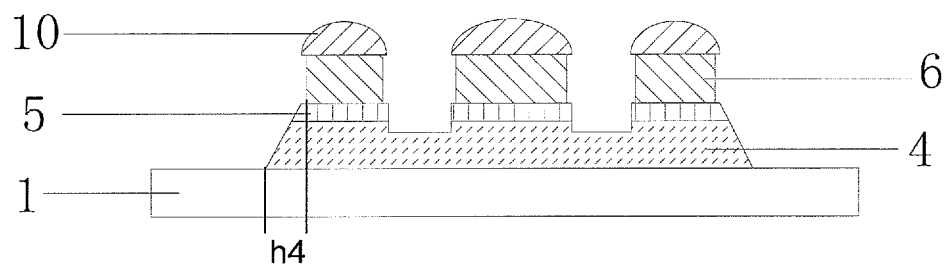

FIGS. 6-1(a) to 6-5(b) are schematic diagrams showing the etching effect of a SDT etching during manufacturing a TFT-LCD array substrate by the method according to the embodiment of the disclosed technology, wherein FIGS. 6-1(a), 6-2(a), 6-3(a), 6-4(a), and 6-5(a) are cross sectional views of a part corresponding to a data line, i.e., cross sectional views corresponding to a location as indicated by A-A in FIG. 1, and FIGS. 6-1(b), 6-2(b), 6-3(b), 6-4(b), and 6-5(b) are cross sectional views of a part corresponding to a thin film transistor, i.e., cross sectional views corresponding to a location as indicated by B-B in FIG. 1. For convenience of illustration, the gate insulating layer is omitted in these figures. The method according to an embodiment of the disclosed technology comprises the following steps.

B1, forming a gate electrode signal line and a gate electrode on a base substrate (for example, a glass substrate) 1, successively depositing a gate insulating layer (not shown), an active layer (for example, including an amorphous silicon layer 4 and an ohmic contact layer 5), and a metal layer 6; forming a photoresist pattern by performing a exposure and development process through a gray tone mask or a half tone mask (the structure after the development process is shown in FIGS. 6-1(a) and 6-1(b)); and then performing a first wet etching so as to remove the metal layer 6 outside a region for forming a data line, a channel and source/drain electrodes, and the structure obtained after the first wet etching is shown in FIGS. 6-2(a) and 6-2(b).

B2, simultaneously etching the active layer outside the region for forming the data line, the channel and the source/drain electrodes and ashing the photoresist so as to expose the metal layer 6 within the channel region. As shown in FIGS. 6-3(a) and 6-3(b), after this step, the width of the top portion of the active layer is identical to the width of the photoresist 10 after being ached. In this step, the active layer outside the region for forming the data line, the channel and the source/drain electrodes is only partially etched (for example, the thickness is reduced), but not etched completely, as shown in FIG. 6-3(a).

In the step of B2, a gas mixture of $SF_6$, $O_2$ and $Cl_2$ is used. As for this gas mixture, it can have a relatively large etching rate on both the photoresist and the active layer by adjusting the content of each gas therein. Alternatively, the $SF_6$ in the above gas mixture can be replaced by other gas containing fluorine such as $CF_4$; and the $Cl_2$ can be replaced by other gas containing chlorine such as $CH_3Cl$. In addition, after the step B2, a certain thickness of active layer outside the region for forming the data line, the channel and the source/drain electrodes is remained, and this layer of the residual active layer can protect the underlying gate insulating layer from being etched by the above gas mixture.

B3, performing a second wet etch or a dry etch on the substrate 1 after the step B2 so as to remove the metal layer 6 within the channel region and form the source/drain electrodes, simultaneously etching the residual active layer outside the region for forming the data line, the channel and the source/drain electrodes (a second active layer etching), as shown in FIGS. 6-4(a) and 6-4(b).

B4, removing a part of the active layer within the channel region by a $N^+$ etching so as to form a channel, as shown in FIGS. 6-5(a) and 6-5(b). In this etching step, it should be ensured that at least the entire of the ohmic layer in the channel region is removed, as shown in FIG. 6-5(b).

B5, depositing a passivation layer on the substrate 1 after the step S5 and forming a passivation layer via hole in the portion corresponding to the drain electrode; depositing a ITO electrode layer, forming a ITO electrode (pixel electrode) which is connected with the drain electrode through the passivation layer via hole.

The thickness of the residual active layer after performing the step B2 is about 200-500 Å, and the residual active layer will be etched when performing the step B3. The step B3 is mainly used to remove the metal layer within the channel region, and it may have a relatively large etching rate on the metal layer and a relatively small etching rate on the active layer for ensuring a uniformity of etching.

Similar to the method of the second embodiment, the method of the present embodiment is further simplified, which saves the time of separately performing the second active layer etching to etch the residual active layer. Meanwhile, the switching time from the step S2 to the step S2-1 in the method of the first embodiment is omitted, and the yield can be enhanced. In addition, the width "h4" (as shown in FIGS. 6-5(a) and 6-5(b)) of the active layer at the two sides of the data lines and at the two sides of the TFT region is also satisfying.

In the various embodiments of the disclosed technology, for the convenience of illustration, a thin film transistor (TFT) with "U" shaped channel structure is taken as an example. However, the disclosed technology is not limited thereto, a TFT with "-" shaped type channel structure or other possible structures can also be used. Moreover, in the various embodiments of the disclosed technology, although a method for manufacturing a TN type array substrate is taken as an example to explain the technical solution, the technical solutions of the various embodiments of the disclosed technology are also be applicable in manufacturing array substrates of other types, for example, an array substrates of other types such as FFS (Fringe Field Switch) type, IPS (In Plane Switch) type, and etc. The manufacturing method of the TFT-LCD array substrate described in the various embodiments of the disclosed technology may be not only applied in manufacturing the conventional TFT-LCD array substrate, but also applied in manufacturing an array substrate of electronic paper and a back plate of OLED (Organic Light Emitting Display); thus, the array substrate in the various embodiments of the disclosed technology adopts a generalized conception, which comprises TFT-LCD array substrate, array substrate of electronic paper and back plate of OLED.

It should be noted that the above embodiments only have the purpose of illustrating the disclosed technology, but not limiting it. Although the disclosed technology has been described with reference to the above embodiment, those skilled in the art should understand that modifications or alternations can be made to the solution or the technical feature in the described embodiments without departing from the spirit and scope of the disclosed technology.

What is claimed is:

1. A manufacturing method of an array substrate, comprising the following steps:

S1. forming a gate signal line and a gate electrode on a base substrate, successively depositing a gate insulating layer, an active layer, and a metal layer, forming a photoresist pattern on the metal layer, and removing the metal layer outside a region for forming a data line, a channel and source/drain electrodes with the photoresist pattern as an etching mask;

S2. etching the active layer outside the region for forming the data line, the channel and the source/drain electrodes and, at the same time, ashing the photoresist so as to expose the metal layer within a channel region;

S3. removing the metal layer within the channel region by performing a wet etch or a dry etch so as to form the source/drain electrodes;

S4. removing a part of the active layer within the channel region so as to form the channel; and S5. depositing a passivation layer on the base substrate after the step S4, forming a passivation layer via hole in the passivation layer above the drain electrode; depositing a transparent pixel electrode layer, and forming a pixel electrode which is connected with the drain electrode through the passivation layer via hole;

wherein, after etching the active layer in the step S2, a certain thickness of active layer outside the region for forming the data line, the channel and the source/drain electrodes is remained.

2. The method of claim 1, wherein the certain thickness of active layer remained outside the region for forming the data line, the channel and the source/drain electrodes is etched while the metal layer is etched in the step S3.

3. The method of claim 1, wherein the certain thickness of active layer remained outside the region for forming the data line, the channel and the source/drain electrodes is etched while the part of the active layer within the channel region is removed in the step S4.

4. The method of claim 1, wherein the step S1 comprises:
S1.1, depositing a gate metal film on the base substrate, and forming the gate signal line and the gate electrode by a patterning process;
S1.2, successively depositing the gate insulating layer, an amorphous silicon layer, an ohmic contact layer, and the metal layer, and forming the photoresist pattern on the metal layer, wherein the amorphous silicon layer and the ohmic contact layer constitute the active layer; and
S1.3, removing the part of the metal layer outside the region for forming the data line, the channel and the source/drain electrodes by using a wet etching.

5. The method of claim 1, wherein, after etching the active layer and aching the photoresist in the step S2, the width of the top portion of the active layer is identical to that of the photoresist after being ached.

6. The method of claim 1, wherein in the step S5, forming the pixel electrode comprises:
depositing an indium tin oxide (ITO) layer on the base substrate formed with the passivation layer and the passivation layer via hole, patterning the ITO layer so as to form the pixel electrode.

7. The method of claim 1, wherein forming the photoresist pattern in the Step 1 comprises:
forming a layer of photoresist on the metal layer;
exposing the photoresist through a grey tone mask or a half tone mask; and
developing the photoresist after being exposed so as to form the photoresist pattern.

8. The method of claim 1, wherein the photoresist pattern comprises at least two parts with different thicknesses, the part with larger thickness covers a region for forming the data line and the source/drain electrodes, and the part with smaller thickness covers a region for forming the channel.

9. The method of claim 1, wherein the method further comprises the following step after the step S2 and before the step S3:
S2-1, etching the certain thickness of active layer remained outside the region for forming the data line, the channel and the source/drain electrodes and a part of photoresist on the base substrate after the step S2 so as to remove the certain thickness of active layer.

10. The method of claim 9, wherein the etching process in the step S2-1 has an etching rate on the active layer higher than that of the etching process in the step S2.

11. The method of claim 9, wherein the width of a part of the active layer which extends beyond an edge of the data line after the step S2-1 is smaller than that after the step S2.

12. The method of claim 9, wherein both the etching processes on the active layer in the step S2 and the step S2-1 employ a dry etch.

13. The method of claim 12, wherein a gas mixture of a gas containing fluorine, a gas containing chlorine, and $O_2$ is used in the dry etch.

14. The method of claim 13, wherein the gas containing fluorine is $SF_6$, $CF_4$ or a combination thereof, and the gas containing chlorine is $Cl_2$, $CH_3Cl$ or a combination thereof.

* * * * *